(12) United States Patent
Fox et al.

(10) Patent No.: US 10,091,035 B2
(45) Date of Patent: Oct. 2, 2018

(54) METHODS AND SYSTEMS FOR HIGH BANDWIDTH COMMUNICATIONS INTERFACE

(71) Applicant: KANDOU LABS, S.A., Lausanne (CH)

(72) Inventors: John Fox, Kislingbury (GB); Brian Holden, Monte Sereno, CA (US); Ali Hormati, Chavannes-pres-Renens (CH); Peter Hunt, Northampton (GB); John D. Keay, Bedford (GB); Amin Shokrollahi, Preverenges (CH); Richard Simpson, Bedford (GB); Anant Singh, Pully (CH); Andrew Kevin John Stewart, Astcote (GB); Giuseppe Surace, Northampton (GB); Roger Ulrich, Bern (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/457,935

(22) Filed: Mar. 13, 2017

(65) Prior Publication Data

US 2017/0279642 A1 Sep. 28, 2017

Related U.S. Application Data

(63) Continuation of application No. 14/253,584, filed on Apr. 15, 2014, now Pat. No. 9,596,109.
(Continued)

(51) Int. Cl.
*H04L 25/08* (2006.01)
*H04L 25/03* (2006.01)
(Continued)

(52) U.S. Cl.
CPC ........ *H04L 25/085* (2013.01); *H04L 25/0272* (2013.01); *H04L 25/03057* (2013.01);
(Continued)

(58) Field of Classification Search
CPC ............... H04L 25/085; H04L 25/0272; H04L 25/03057; H04L 25/03885; H04L 1/0041;
(Continued)

(56) References Cited

U.S. PATENT DOCUMENTS 668,687 A 2/1901 Mayer
780,883 A 1/1905 Hinchman
(Continued)

FOREIGN PATENT DOCUMENTS

CN 1864346 11/2006
CN 101478286 7/2009
(Continued)

OTHER PUBLICATIONS

Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/ 13_09/holden_400_01_0913.pdf.
(Continued)

*Primary Examiner* — Janice Tieu
(74) *Attorney, Agent, or Firm* — Invention Mine, LLC

(57) ABSTRACT

Systems and methods are described for transmitting data over physical channels to provide a high bandwidth, low latency interface between a transmitting device and a receiving device operating at high speed with low power utilization. Communication is performed using group signaling over sets of four wires using a vector signaling code, where each wire of a set carries a low-swing signal that may take on one of four signal values. Topologies and designs of wire sets are disclosed with preferred characteristics for group signaling communications.

18 Claims, 9 Drawing Sheets

Related U.S. Application Data

(60) Provisional application No. 61/812,667, filed on Apr. 16, 2013.

(51) Int. Cl.

| | | |
|---|---|---|
| *H04L 25/02* | (2006.01) | |
| *H03M 5/16* | (2006.01) | |
| *H04L 1/00* | (2006.01) | |
| *H03M 5/04* | (2006.01) | |
| *H03M 13/31* | (2006.01) | |

(52) U.S. Cl.
CPC ......... *H04L 25/03885* (2013.01); *H03M 5/04* (2013.01); *H03M 5/16* (2013.01); *H03M 13/31* (2013.01); *H04L 1/0041* (2013.01); *H04L 1/0057* (2013.01); *H04L 2001/0094* (2013.01)

(58) Field of Classification Search
CPC .......... H04L 1/0057; H04L 2001/0094; H03M 5/04; H03M 5/16; H03M 13/31
See application file for complete search history.

(56) References Cited

U.S. PATENT DOCUMENTS

| | | | |
|---|---|---|---|
| 3,196,351 A | 7/1965 | Slepian | |
| 3,636,463 A | 1/1972 | Ongkiehong | |
| 3,939,468 A | 2/1976 | Mastin | |
| 4,163,258 A | 7/1979 | Ebihara | |
| 4,181,967 A | 1/1980 | Nash | |
| 4,206,316 A | 6/1980 | Bumsweig | |
| 4,276,543 A | 6/1981 | Miller | |
| 4,486,739 A | 12/1984 | Franaszek | |
| 4,499,550 A | 2/1985 | Ray, III | |
| 4,722,084 A | 1/1988 | Morton | |
| 4,772,845 A | 9/1988 | Scott | |
| 4,774,498 A | 9/1988 | Traa | |
| 4,864,303 A | 9/1989 | Ofek | |
| 4,897,657 A | 1/1990 | Brubaker | |
| 4,974,211 A | 11/1990 | Corl | |
| 5,017,924 A | 5/1991 | Guiberteau | |
| 5,053,974 A | 10/1991 | Penz | |
| 5,166,956 A | 11/1992 | Baltus | |
| 5,168,509 A | 12/1992 | Nakamura | |
| 5,266,907 A | 11/1993 | Dacus | |
| 5,283,761 A | 2/1994 | Gillingham | |
| 5,287,305 A | 2/1994 | Yoshida | |
| 5,311,516 A | 5/1994 | Kuznicki | |
| 5,331,320 A | 7/1994 | Cideciyan | |
| 5,412,689 A | 5/1995 | Chan | |
| 5,449,895 A | 9/1995 | Hecht | |
| 5,459,465 A | 10/1995 | Kagey | |
| 5,461,379 A | 10/1995 | Weinman | |
| 5,510,736 A | 4/1996 | Van De Plassche | |
| 5,511,119 A | 4/1996 | Lechleider | |
| 5,553,097 A | 9/1996 | Dagher | |
| 5,566,193 A | 10/1996 | Cloonan | |
| 5,599,550 A | 2/1997 | Kohlruss | |
| 5,626,651 A | 5/1997 | Dullien | |
| 5,629,651 A | 5/1997 | Mizuno | |
| 5,659,353 A | 8/1997 | Kostreski | |
| 5,727,006 A | 3/1998 | Dreyer | |
| 5,748,948 A | 5/1998 | Yu | |
| 5,802,356 A | 9/1998 | Gaskins | |
| 5,825,808 A | 10/1998 | Hershey | |
| 5,856,935 A | 1/1999 | Moy | |
| 5,875,202 A | 2/1999 | Venters | |
| 5,945,935 A | 8/1999 | Kusumoto | |
| 5,949,060 A | 9/1999 | Schattschneider | |
| 5,982,954 A | 11/1999 | Delen | |
| 5,995,016 A | 11/1999 | Perino | |
| 5,999,016 A | 12/1999 | McClintock | |
| 6,005,895 A | 12/1999 | Perino | |
| 6,084,883 A | 7/2000 | Norrell | |
| 6,119,263 A | 9/2000 | Mowbray | |
| 6,172,634 B1 | 1/2001 | Leonowich | |
| 6,175,230 B1 | 1/2001 | Hamblin | |
| 6,232,908 B1 | 5/2001 | Nakaigawa | |
| 6,278,740 B1 | 8/2001 | Nordyke | |
| 6,316,987 B1 | 11/2001 | Dally | |
| 6,346,907 B1 | 2/2002 | Dacy | |
| 6,359,931 B1 | 3/2002 | Perino | |
| 6,378,073 B1 | 4/2002 | Davis | |
| 6,384,758 B1 | 5/2002 | Michalski | |
| 6,398,359 B1 | 6/2002 | Silverbrook | |
| 6,404,820 B1 | 6/2002 | Postol | |
| 6,417,737 B1 | 7/2002 | Moloudi | |
| 6,433,800 B1 | 8/2002 | Holtz | |
| 6,452,420 B1 | 9/2002 | Wong | |
| 6,473,877 B1 | 10/2002 | Sharma | |
| 6,483,828 B1 | 11/2002 | Balachandran | |
| 6,504,875 B2 | 1/2003 | Perino | |
| 6,509,773 B2 | 1/2003 | Buchwald | |
| 6,522,699 B1 | 2/2003 | Anderson | |
| 6,556,628 B1 | 4/2003 | Poulton | |
| 6,563,382 B1 | 5/2003 | Yang | |
| 6,621,427 B2 | 9/2003 | Greenstreet | |
| 6,624,699 B2 | 9/2003 | Yin | |
| 6,650,638 B1 | 11/2003 | Walker | |
| 6,661,355 B2 | 12/2003 | Cornelius | |
| 6,664,355 B2 | 12/2003 | Kim | |
| 6,686,879 B2 | 2/2004 | Shattil | |
| 6,690,739 B1 * | 2/2004 | Mui ..................... H04L 1/0054 375/265 |
| 6,766,342 B2 | 7/2004 | Kechriotis | |
| 6,772,351 B1 | 8/2004 | Werner | |
| 6,839,429 B1 | 1/2005 | Gaikwad | |
| 6,839,587 B2 | 1/2005 | Yonce | |
| 6,854,030 B2 | 2/2005 | Perino | |
| 6,865,234 B1 | 3/2005 | Agazzi | |
| 6,865,236 B1 | 3/2005 | Terry | |
| 6,876,317 B2 | 4/2005 | Sankaran | |
| 6,898,724 B2 | 5/2005 | Chang | |
| 6,927,709 B2 | 8/2005 | Kiehl | |
| 6,954,492 B1 | 10/2005 | Williams | |
| 6,963,622 B2 | 11/2005 | Eroz | |
| 6,972,701 B2 | 12/2005 | Jansson | |
| 6,973,613 B2 | 12/2005 | Cypher | |
| 6,976,194 B2 | 12/2005 | Cypher | |
| 6,982,954 B2 | 1/2006 | Dhong | |
| 6,990,138 B2 | 1/2006 | Bejjani | |
| 6,991,038 B2 | 1/2006 | Guesnon | |
| 6,993,311 B2 | 1/2006 | Li | |
| 6,999,516 B1 | 2/2006 | Rajan | |
| 7,023,817 B2 | 4/2006 | Kuffner | |
| 7,039,136 B2 | 5/2006 | Olson | |
| 7,053,802 B2 | 5/2006 | Cornelius | |
| 7,075,996 B2 | 7/2006 | Simon | |
| 7,080,288 B2 | 7/2006 | Ferraiolo | |
| 7,082,557 B2 | 7/2006 | Schauer | |
| 7,085,153 B2 | 8/2006 | Ferrant | |
| 7,085,336 B2 | 8/2006 | Lee | |
| 7,127,003 B2 | 10/2006 | Rajan | |
| 7,130,944 B2 | 10/2006 | Perino | |
| 7,142,612 B2 | 11/2006 | Horowitz | |
| 7,142,865 B2 | 11/2006 | Tsai | |
| 7,164,631 B2 | 1/2007 | Tateishi | |
| 7,167,019 B2 | 1/2007 | Broyde | |
| 7,176,823 B2 | 2/2007 | Zabroda | |
| 7,180,949 B2 | 2/2007 | Kleveland | |
| 7,184,483 B2 | 2/2007 | Rajan | |
| 7,199,728 B2 | 4/2007 | Dally | |
| 7,231,558 B2 | 6/2007 | Gentieu | |
| 7,269,130 B2 | 9/2007 | Pitio | |
| 7,269,212 B1 | 9/2007 | Chau | |
| 7,335,976 B2 | 2/2008 | Chen | |
| 7,336,112 B1 | 2/2008 | Sha | |
| 7,339,990 B2 | 3/2008 | Hidaka | |
| 7,346,819 B2 | 3/2008 | Bansal | |
| 7,348,989 B2 | 3/2008 | Stevens | |
| 7,349,484 B2 | 3/2008 | Stojanovic | |
| 7,356,213 B1 | 4/2008 | Cunningham | |
| 7,358,869 B1 | 4/2008 | Chiarulli | |
| 7,362,130 B2 | 4/2008 | Broyde | |

(56) References Cited

U.S. PATENT DOCUMENTS

| | | |
|---|---|---|
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,649,556 B2 | 2/2014 | Wedge |
| 8,649,840 B2 | 2/2014 | Sheppard, Jr. |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |

(56) References Cited

U.S. PATENT DOCUMENTS

| | | | |
|---|---|---|---|
| 9,461,862 B2 | 10/2016 | Holden | |
| 9,479,369 B1 | 10/2016 | Shokrollahi | |
| 9,509,437 B2 | 11/2016 | Shokrollahi | |
| 9,544,015 B2 | 1/2017 | Ulrich | |
| 9,634,797 B2* | 4/2017 | Benammar | H04L 1/0041 |
| 9,667,379 B2 | 5/2017 | Cronie | |
| 2001/0006538 A1 | 7/2001 | Simon | |
| 2001/0055344 A1 | 12/2001 | Lee | |
| 2002/0034191 A1 | 3/2002 | Shattil | |
| 2002/0044316 A1 | 4/2002 | Myers | |
| 2002/0057592 A1 | 5/2002 | Robb | |
| 2002/0154633 A1 | 10/2002 | Shin | |
| 2002/0163881 A1 | 11/2002 | Dhong | |
| 2002/0167339 A1 | 11/2002 | Chang | |
| 2002/0174373 A1 | 11/2002 | Chang | |
| 2002/0181607 A1 | 12/2002 | Izumi | |
| 2003/0016763 A1 | 1/2003 | Doi | |
| 2003/0016770 A1 | 1/2003 | Trans | |
| 2003/0046618 A1 | 3/2003 | Collins | |
| 2003/0085763 A1 | 5/2003 | Schrodinger | |
| 2003/0146783 A1 | 8/2003 | Bandy | |
| 2003/0174023 A1 | 9/2003 | Miyasita | |
| 2003/0185310 A1* | 10/2003 | Ketchum | H04B 7/005 375/259 |
| 2003/0218558 A1 | 11/2003 | Mulder | |
| 2004/0027185 A1 | 2/2004 | Fiedler | |
| 2004/0146117 A1 | 7/2004 | Subramaniam | |
| 2004/0155802 A1 | 8/2004 | Lamy | |
| 2004/0161019 A1 | 8/2004 | Raghavan | |
| 2004/0169529 A1 | 9/2004 | Afghahi | |
| 2005/0063493 A1 | 3/2005 | Foster | |
| 2005/0134380 A1 | 6/2005 | Nairn | |
| 2005/0174841 A1 | 8/2005 | Ho | |
| 2005/0195000 A1 | 9/2005 | Parker | |
| 2005/0201491 A1 | 9/2005 | Wei | |
| 2005/0213686 A1 | 9/2005 | Love | |
| 2005/0220182 A1 | 10/2005 | Kuwata | |
| 2005/0270098 A1 | 12/2005 | Zhang | |
| 2006/0036668 A1 | 2/2006 | Jaussi | |
| 2006/0097786 A1 | 5/2006 | Su | |
| 2006/0103463 A1 | 5/2006 | Lee | |
| 2006/0120486 A1 | 6/2006 | Visalli | |
| 2006/0126751 A1 | 6/2006 | Bessios | |
| 2006/0133538 A1 | 6/2006 | Stojanovic | |
| 2006/0140324 A1 | 6/2006 | Casper | |
| 2006/0159005 A1 | 7/2006 | Rawlins | |
| 2006/0233291 A1 | 10/2006 | Garlepp | |
| 2007/0001723 A1 | 1/2007 | Lin | |
| 2007/0002954 A1 | 1/2007 | Cornelius | |
| 2007/0030796 A1 | 2/2007 | Green | |
| 2007/0103338 A1 | 5/2007 | Teo | |
| 2007/0121716 A1 | 5/2007 | Nagarajan | |
| 2007/0182487 A1 | 8/2007 | Ozasa | |
| 2007/0201546 A1 | 8/2007 | Lee | |
| 2007/0204205 A1 | 8/2007 | Niu | |
| 2007/0263711 A1 | 11/2007 | Kramer | |
| 2007/0283210 A1 | 12/2007 | Prasad | |
| 2008/0007367 A1 | 1/2008 | Kim | |
| 2008/0012598 A1 | 1/2008 | Mayer | |
| 2008/0104374 A1 | 5/2008 | Mohamed | |
| 2008/0159448 A1 | 7/2008 | Anim-Appiah | |
| 2008/0192621 A1 | 8/2008 | Suehiro | |
| 2008/0317188 A1 | 12/2008 | Staszewski | |
| 2009/0059782 A1 | 3/2009 | Cole | |
| 2009/0115523 A1 | 5/2009 | Akizuki | |
| 2009/0154604 A1 | 6/2009 | Lee | |
| 2009/0195281 A1 | 8/2009 | Tamura | |
| 2009/0262876 A1 | 10/2009 | Arima | |
| 2009/0316730 A1 | 12/2009 | Feng | |
| 2009/0323864 A1 | 12/2009 | Tired | |
| 2010/0046644 A1 | 2/2010 | Mazet | |
| 2010/0081451 A1 | 4/2010 | Mueck | |
| 2010/0148819 A1 | 6/2010 | Bae | |
| 2010/0180143 A1 | 7/2010 | Ware | |
| 2010/0215087 A1 | 8/2010 | Tsai | |
| 2010/0215112 A1 | 8/2010 | Tsai | |
| 2010/0235673 A1 | 9/2010 | Abbasfar | |
| 2010/0271107 A1 | 10/2010 | Tran | |
| 2010/0283894 A1 | 11/2010 | Horan | |
| 2010/0296556 A1 | 11/2010 | Rave | |
| 2010/0309964 A1 | 12/2010 | Oh | |
| 2011/0014865 A1 | 1/2011 | Seo | |
| 2011/0028089 A1 | 2/2011 | Komori | |
| 2011/0032977 A1 | 2/2011 | Hsiao | |
| 2011/0051854 A1 | 3/2011 | Kizer | |
| 2011/0072330 A1 | 3/2011 | Kolze | |
| 2011/0074488 A1 | 3/2011 | Broyde | |
| 2011/0084737 A1 | 4/2011 | Oh | |
| 2011/0103508 A1 | 5/2011 | Mu | |
| 2011/0127990 A1 | 6/2011 | Wilson | |
| 2011/0228864 A1 | 9/2011 | Aryanfar | |
| 2011/0235501 A1 | 9/2011 | Goulahsen | |
| 2011/0268225 A1 | 11/2011 | Cronie | |
| 2011/0299555 A1 | 12/2011 | Cronie | |
| 2011/0302478 A1 | 12/2011 | Cronie | |
| 2011/0317559 A1 | 12/2011 | Kern | |
| 2012/0082203 A1 | 4/2012 | Zerbe | |
| 2012/0133438 A1 | 5/2012 | Tsuchi | |
| 2012/0152901 A1 | 6/2012 | Nagorny | |
| 2012/0161945 A1 | 6/2012 | Single | |
| 2012/0213299 A1 | 8/2012 | Cronie | |
| 2012/0257683 A1 | 10/2012 | Schwager | |
| 2013/0010892 A1 | 1/2013 | Cronie | |
| 2013/0013870 A1 | 1/2013 | Cronie | |
| 2013/0106513 A1 | 5/2013 | Cyrusian | |
| 2013/0114519 A1 | 5/2013 | Gaal | |
| 2013/0114663 A1 | 5/2013 | Ding | |
| 2013/0129019 A1 | 5/2013 | Sorrells | |
| 2013/0147553 A1 | 6/2013 | Iwamoto | |
| 2013/0188656 A1 | 7/2013 | Ferraiolo | |
| 2013/0195155 A1 | 8/2013 | Pan | |
| 2013/0202065 A1 | 8/2013 | Chmelar | |
| 2013/0215954 A1 | 8/2013 | Beukema | |
| 2013/0259113 A1 | 10/2013 | Kumar | |
| 2013/0271194 A1 | 10/2013 | Pellerano | |
| 2013/0307614 A1 | 11/2013 | Dai | |
| 2013/0314142 A1 | 11/2013 | Tamura | |
| 2013/0315501 A1 | 11/2013 | Atanassov | |
| 2013/0346830 A1 | 12/2013 | Ordentlich | |
| 2014/0159769 A1 | 6/2014 | Hong | |
| 2014/0177645 A1 | 6/2014 | Cronie | |
| 2014/0177696 A1 | 6/2014 | Hwang | |
| 2014/0266440 A1 | 9/2014 | Itagaki | |
| 2014/0269130 A1 | 9/2014 | Maeng | |
| 2015/0049798 A1 | 2/2015 | Hossein | |
| 2015/0070201 A1 | 3/2015 | Dedic | |
| 2015/0078479 A1 | 3/2015 | Whitby-Strevens | |
| 2015/0146771 A1 | 5/2015 | Walter | |
| 2015/0222458 A1 | 8/2015 | Hormati | |
| 2015/0249559 A1 | 9/2015 | Shokrollahi | |
| 2015/0333940 A1 | 11/2015 | Shokrollahi | |
| 2015/0349835 A1 | 12/2015 | Fox | |
| 2015/0380087 A1 | 12/2015 | Mittelholzer | |
| 2015/0381232 A1 | 12/2015 | Ulrich | |
| 2016/0020796 A1 | 1/2016 | Hormati | |
| 2016/0020824 A1 | 1/2016 | Ulrich | |
| 2016/0036616 A1 | 2/2016 | Holden | |
| 2016/0197747 A1 | 7/2016 | Ulrich | |
| 2016/0261435 A1 | 9/2016 | Musah | |
| 2017/0310456 A1 | 10/2017 | Tajalli | |
| 2017/0317449 A1 | 11/2017 | Shokrollahi | |
| 2017/0317855 A1 | 11/2017 | Shokrollahi | |

FOREIGN PATENT DOCUMENTS

| | | |
|---|---|---|
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |

(56) References Cited

FOREIGN PATENT DOCUMENTS

| | | |
|---|---|---|
| WO | 2010031824 | 3/2010 |
| WO | 2011119359 | 9/2011 |

OTHER PUBLICATIONS

Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.

Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.

"Introduction to: Analog Computers and the DSPACE System," Course Material ECE 5230 Spring 2008, Utah State University, www.coursehero.com, 12 pages.

Abbasfar, A., "Generalized Differential Vector Signaling", IEEE International Conference on Communications, ICC 09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Design Brief 208 Using the Anadigm Multiplier CAM, Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http.//www.retrothing.com/2006/08/classic_analog_.html.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 dated Sep. 22, 2011.

International Search Report and Written Opinion for PCT/EP2011/074219 dated Jul. 4, 2012.

International Search Report and Written Opinion for PCT/EP2012/052767 dated May 11, 2012.

International Search Report and Written Opinion for PCT/US14/052986 dated Nov. 24, 2014.

International Search Report and Written Opinion from PCT/US2014/034220 dated Aug. 21, 2014.

International Search Report and Written Opinion of the International Searching Authority, dated Jul. 14, 2011 in International Patent Application S.N. PCT/EP2011/002170, 10 pages.

International Search Report and Written Opinion of the International Searching Authority, dated Nov. 5, 2012, in International Patent Application S.N. PCT/EP2012/052767, 7 pages.

International Search Report for PCT/US2014/053563, dated Nov. 11, 2014, 2 pages.

Jiang, A., et al., "Rank Modulation for Flash Memories", IEEE Transactions of Information Theory, Jun. 2006, vol. 55, No. 6, pp. 2659-2673.

Loh, M., et al., "A 3x9 Gb/s Shared, All-Digital CDR for High-Speed, High-Density I/O", Matthew Loh, IEEE Journal of Solid-State Circuits, Vo. 47, No. 3, Mar. 2012.

Notification of Transmittal of International Search Report and the Written Opinion of the International Searching Authority, for PCT/US2015/018363, dated Jun. 18, 2015, 13 pages.

Notification of Transmittal of the International Search Report and the Written Opinion of the International Searching Authority, or the Declaration for PCT/EP2013/002681, dated Feb. 25, 2014, 15 pages.

Notification of Transmittal of the International Search Report and the Written Opinion of the International Searching Authority, or the Declaration, dated Mar. 3, 2015, for PCT/US2014/066893, 9 pages.

Notification of Transmittal of the International Search Report and the Written Opinion of the International Searching Authority, or the Declaration, for PCT/US2014/015840, dated May 20, 2014. 11 pages.

Notification of Transmittal of the International Search Report and the Written Opinion of the International Searching Authority, or the Declaration, for PCT/US2014/043965, dated Oct. 22, 2014, 10 pages.

Notification of Transmittal of the International Search Report and the Written Opinion of the International Searching Authority, or the Declaration, for PCT/US2015/037466, dated Nov. 19, 2015.

Notification of Transmittal of the International Search Report and the Written Opinion of the International Searching Authority, or the Declaration, for PCT/US2015/039952, dated Sep. 23, 2015, 8 pages.

Notification of Transmittal of the International Search Report and the Written Opinion of the International Searching Authority, or the Declaration, for PCT/US2015/041161, dated Oct. 7, 2015, 8 pages.

Notification of Transmittal of the International Search Report and the Written Opinion of the International Searching Authority, or the Declaration, for PCT/US2015/043463, dated Oct. 16, 2015, 8 pages.

Oh, et al., Pseudo-Differential Vector Signaling for Noise Reduction in Single-Ended Signaling, DesignCon 2009.

Poulton, et al., "Multiwire Differential Signaling", UNC-CH Department of Computer Science Version 1.1, Aug. 6, 2003.

Schneider, J., et al., "ELEC301 Project: Building an Analog Computer," Dec. 19, 1999, 8 pages, http://www.clear.rice.edu/elec301/Projects99/anlgcomp/.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Skliar et al., A Method for the Analysis of Signals: the Square-Wave Method, Mar. 2008, Revista de Matematica: Teoria y Aplicationes, pp. 109-129.

Slepian, D., "Premutation Modulation", IEEE, vol. 52, No. 3, Mar. 1965, pp. 228-236.

Stan, M., et al., "Bus-Invert Coding for Low-Power I/O, IEEE Transactions on Very Large Scale Integration (VLSI) Systems", vol. 3, No. 1, Mar. 1995, pp. 49-58.

Tallini, L., et al., "Transmission Time Analysis for the Parallel Asynchronous Communication Scheme", IEEE Transactions on Computers, vol. 52, No. 5, May 2003, pp. 558-571.

Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.

Wang et al., "Applying CDMA Technique to Network-on-Chip", IEEE Transactions on Very Large Scale Integration (VLSI) Systems, vol. 15, No. 10 (Oct. 1, 2007), pp. 1091-1100.

Zouhair Ben-Neticha et al, "The streTched —Golay and other codes for high-SNR fnite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.

(56) References Cited

OTHER PUBLICATIONS

Notification of Transmittal of the International Search Report and the Written Opinion of the International Searching Authority, or the Declaration, dated Feb. 15, 2017, 10 pages.

Notification of Transmittal of the International Search Report and the Written Opinion of the International Searching Authority, or the Declaration., for PCT/US17/14997, dated Apr. 7, 2017.

Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

* cited by examiner

| Transmit value | Wire 1 | Wire 2 | Wire 3 | Wire 4 | (Wire1+Wire2) > (Wire3+Wire4) | (Wire1+Wire3) > (Wire2+Wire4) | (Wire1+Wire4) > (Wire2+Wire3) | Receive Word |
|---|---|---|---|---|---|---|---|---|
| 7 | 1 | -1/3 | -1/3 | -1/3 | + | + | + | 111 |
| 4 | -1/3 | 1 | -1/3 | -1/3 | + | - | - | 100 |
| 2 | -1/3 | -1/3 | 1 | -1/3 | - | + | - | 010 |
| 1 | -1/3 | -1/3 | -1/3 | 1 | - | - | + | 001 |
| 0 | -1 | 1/3 | 1/3 | 1/3 | - | - | - | 000 |
| 3 | 1/3 | -1 | 1/3 | 1/3 | - | + | + | 011 |
| 5 | 1/3 | 1/3 | -1 | 1/3 | + | - | + | 101 |
| 6 | 1/3 | 1/3 | 1/3 | -1 | + | + | - | 110 |

FIG. 6

METHODS AND SYSTEMS FOR HIGH BANDWIDTH COMMUNICATIONS INTERFACE

CROSS REFERENCES

This application is a continuation of U.S. application Ser. No. 14/253,584, FILED Apr. 15, 2014, entitled "METHODS AND SYSTEMS FOR HIGH BANDWIDTH COMMUNICATIONS INTERFACE", which claims the benefit of U.S. provisional application No. 61/812,667 filed on Apr. 16, 2013, the contents of which are incorporated herein by reference in their entirety for all purposes.

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III");

U.S. Provisional Patent Application No. 61/753,870, filed Jan. 17, 2013, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I"); and U.S. Provisional Patent Application No. 61/763,403, filed Feb. 11, 2013, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II").

U.S. Provisional Patent Application No. 61/773,709, filed Mar. 6, 2013, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III").

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives the signal or signals (or at least something close, as noise and other effects might keep the received signal from being identical to the sent signal). The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires required for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is $2^8$, or 256.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, Fox I, Fox II, and Fox III.

BRIEF SUMMARY

A transmitter and receiver can communicate using a serial communications link, wherein the serial communications link uses signaling that is vector signaling, balanced and can be detected using a plurality of comparators having inputs coupled to differing combinations of sums of components of a vector signal.

The number of components can be four, or more or less than four. The number of coordinate values for a component can be four, or more or less than four. For example, a link might use four components with four possible coordinate values, a high value, a low value, and inverses of the high and low values, such that a signal having the high value cancels out three signals having the inverse of the low value and a signal having the inverse of the high value cancels out three signals having the low value and, in this manner, the link can convey three bits in a signal period using those four components by mapping the eight possible three bit combinations onto the eight vector code words represented by the four permutations of one high value and three inverses of the low value plus the four permutations of the inverse of one high value and three low values. In a more specific embodiment, the high and low values are voltage values and relative to a reference, the high value and its inverse have the same magnitude but opposite signs, the low value and its inverse have the same magnitude but opposite signs, and the high value has a magnitude three times the low value.

In a receiver, some number of comparators compares sums of signals. In a specific embodiment, there are three comparators, each which compares sums of two of the received signals and collectively the output of the three comparators identify the three bits encoded by the signals. Signal equalization as commonly provided using Decision Feedback Equalization techniques may be advantageously applied at this receive comparison stage, or may more conventionally be applied to the received wire signals.

In accordance with at least one embodiment of the invention, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a ternary vector signaling code wherein each wire signal has one of three values, or a quaternary signaling system wherein each wire signal has one of four values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

FIG. 6 is a chart shown example transmit wire values for each transmit data value, and corresponding example receive comparator outputs and receive data words, in accordance with at least one embodiment of the invention.

DETAILED DESCRIPTION

Despite the increasing technological ability to integrate entire systems into a single integrated circuit, multiple chip systems and subsystems retain significant advantages. The physical infrastructure to support high-bandwidth chip-to-chip connectivity is available, if the power, complexity, and other circuit implementation issues for such interfaces could be resolved.

For purposes of description and without limitation, example embodiments of at least some aspects of the invention herein described assume a systems environment of (1) at least one point-to-point communications interface connecting two integrated circuit chips representing a transmitter and a receiver, (2) wherein the communications interface is supported by an interconnection group of four high-speed transmission line signal wires providing medium loss connectivity at, as an example, 18.75 GHz (37.3 Giga-Symbols/second) without excessive ripple loss characteristics or reflections, (3) the interconnection group of signal wires displaying low intra-ensemble skew, and (4) the communications interface operating at the example signaling rate of 37.3 GigaSymbols/second, delivering an aggregate throughput of approximately 112 gigabits/sec over the four wire circuit.

As subsequently described, at least one embodiment of the invention uses low signal swing current mode logic pin drivers and interconnection wiring terminated at both transmitter and receiver.

Physical Channel Wiring

Figure 2:
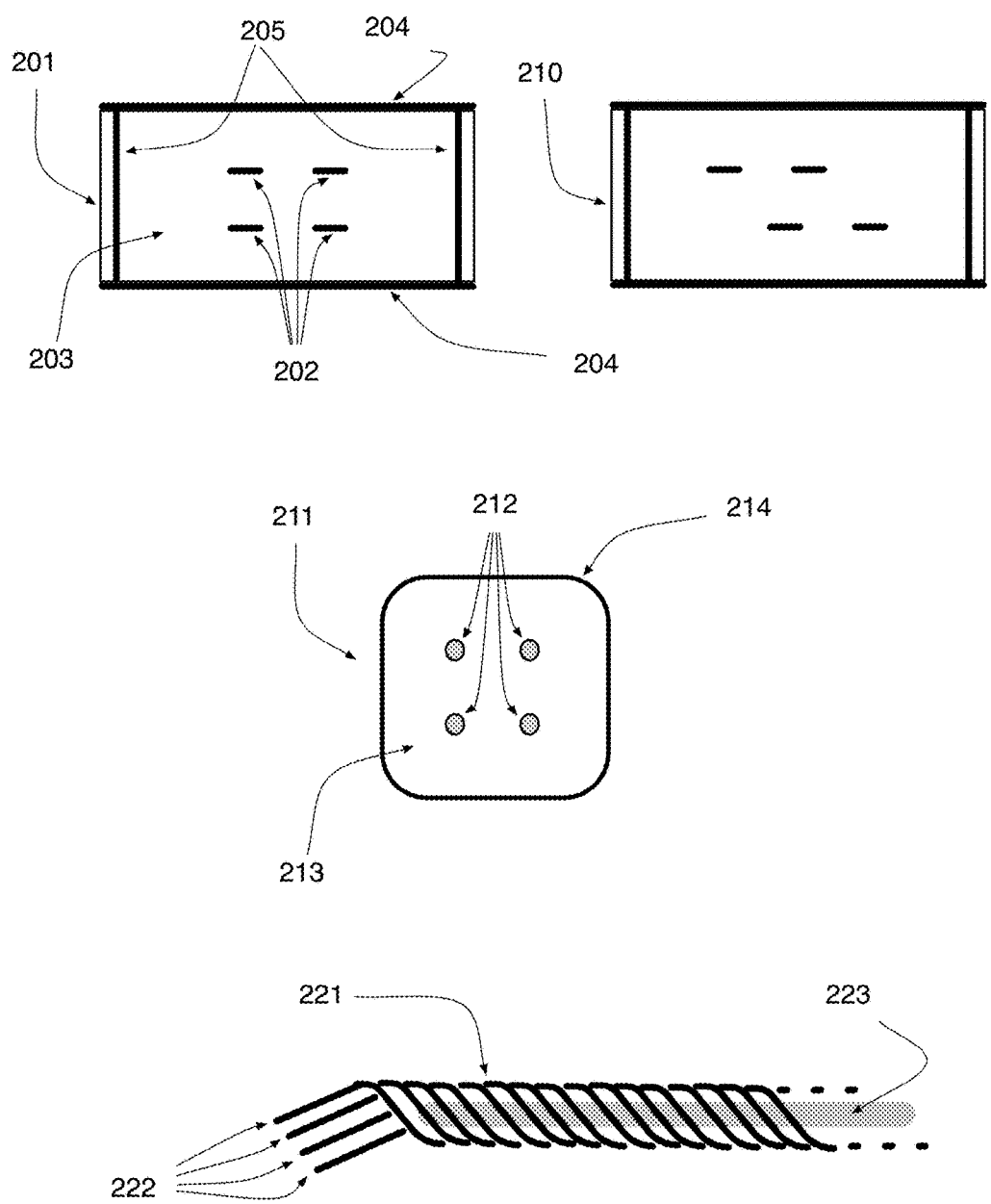
FIG. 2 shows several physical channel topologies suited for use with the described signal coding in at least one embodiment in accordance with the invention.

Several example physical channel topologies in accordance with at least one embodiment of the invention are shown in FIG. 2.

Example configuration 201 illustrates in cross-section a quad-box stripline, with four signal conductors 202 embedded in dielectric medium 203 between ground planes 204. In some embodiments, vias 205 are incorporated to interconnect ground planes 204. In some embodiments, the locations of signal conductors 202 are modified by introducing periodic horizontal position offsets so as to provide more uniform characteristics for the four signal paths. As one example, the upper two signal conductors of 202 may be shifted left as the lower two signal conductors of 202 are simultaneously shifted right as illustrated in 210, and then the direction of these shifts reversed on each subsequent offset cycle, with the period and extent of the offsets chosen to provide more uniform characteristics for the four signal paths.

Example configuration 211 illustrates in cross-section a quadax cable, with four signal conductors 212 embedded in dielectric medium 213 surrounded or essentially surrounded by conductive shield 214. The external profile of the dielectric medium and conductive shield will in practice be a balance between manufacturing simplicity (e.g. a round profile as in conventional coax cable) and optimized transmission characteristics (e.g. the square or rectangular shape of 201) as is suggested by the profile provided for illustrative purposes at 214. As with the previous example, periodic perturbations of the inter-wire spacing of conductors 212 and/or their locations may be made to provide more uniform characteristics for the four signal paths.

Example configuration 221 shows a twisted quad cable, where individually insulated signal conductors 222 are twisted as a group around a common axis, either with or without a central insulating strand 223 to control overall diameter and spacing. Some embodiments may further optionally incorporate at least one of a central conductive neutral wire, surrounding insulation layer, and surrounding conductive shield layer to allow additional control over impedance characteristics and/or noise isolation.

It will be apparent to one familiar with the art that each example of FIG. 2 utilizes three-dimensional structuring of signal conductors to provide essentially equal impedance characteristics for each of the four signal wires, and also essentially equal inter-wire coupling characteristics among the four signal wires. These characteristics facilitate signal propagation modes providing effectively equal propagation velocity for signals on each wire, as well as effectively equal attenuation and frequency response characteristics. Comparable transmission characteristics may also be provided by other known cable designs, including braid twisted quad conductor cable, quad micro-coax cable, etc.

Other known cable designs including quad microstripline, dual pair microstripline, and dual twisted pair may also be usable with the described invention under some conditions. With such cables, not all signal propagation modes for the subsequently described H4 coded signals are identical, typically with one of the three major propagation modes experiencing reduced receive signal levels and slower propagation velocity. Some embodiments of the invention provide compensation for these effects through additional amplification of received signals of the degraded mode and delayed sampling of that mode's received signal values. Other embodiments provide a legacy communication capability, where signals are communicated using conventional dual differential transmission and reception, with reduced aggregate communications throughput.

Example signal levels, signal frequencies, and physical dimensions described herein are provided for purposes of explanation, and are not limiting. Other embodiments of the invention may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with the invention.

Encoding Information using Hadamard Transforms

The Hadamard Transform, also known as the Walsh-Hadamard transform, is a square matrix of entries +1 and −1 so arranged that both all rows and all columns are mutually orthogonal. Hadamard matrices are known for all sizes 2N as well as for selected other sizes. In particular, the descriptions herein rely on 2×2 and 4×4 Hadamard matrices.

Figure 3A:
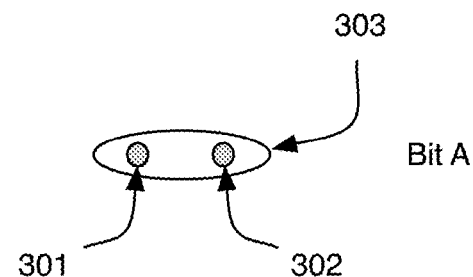
FIGS. 3A and 3B illustrate different transmission modes in differential and H4 encoded communications.

The order 2 Hadamard matrix is:

$$H_2 = \begin{bmatrix} 1 & 1 \\ 1 & -1 \end{bmatrix} \quad \text{(Eqn. 1)}$$

and conventional differential encoding of one bit A may be obtained by multiplying A by the Hadamard matrix $H_2$ to obtain values for the resulting output signals W and X. It will be apparent to one familiar with the art that multiplication times the upper vector of the matrix corresponds to introduction of a positive or negative common-mode signal onto W and X, a transmission mode not generally used in practice on differential circuits, while multiplication times the lower vector of the matrix produces the familiar differential signals of $\{+1, -1\}$ for A positive, and $\{-1, +1\}$ for A negative. This is illustrated in FIG. 3A, where the two signal lines 301 and 302 representing the signals W and X carry the encoded transmission mode 303 representing the $\{+1, -1\}$ vector multiplied by the encoded bit A.

The order 4 Hadamard matrix is:

$$H_4 = \begin{bmatrix} +1 & +1 & +1 & +1 \\ +1 & -1 & +1 & -1 \\ +1 & +1 & -1 & -1 \\ +1 & -1 & -1 & +1 \end{bmatrix} \quad \text{(Eqn. 2)}$$

and encoding of the three bits A, B, C may be obtained by multiplying those bits times the Hadamard matrix $H_4$ to obtain four output values. As in the previous example, the uppermost vector corresponds to common mode signaling, which is not used herein, with the next three vectors being used to encode bits A, B, and C respectively into outputs W, X, Y, Z. This is graphically illustrated in FIG. 3B, where the four signal line 311, 312, 313, and 314 represent the signals W, X, Y, Z respectively in each illustration, with the three illustrations representing the three distinct transmission modes representing the bit A multiplied by the vector $\{+1, -1, +1, -1\}$ at 320, the bit B multiplied by the vector $\{+1, +1, -1, -1\}$ at 330, and the bit C multiplied by the vector $\{+1, -1, -1, +1\}$ at 340.

Figure 3B:
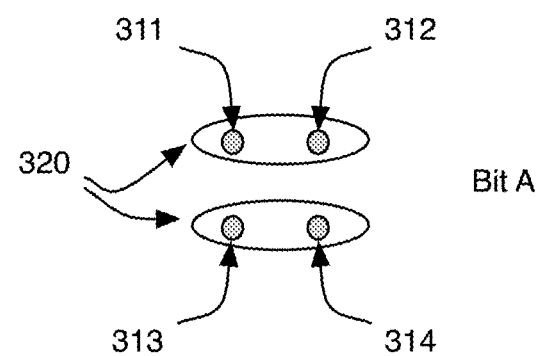
Figure 3B:
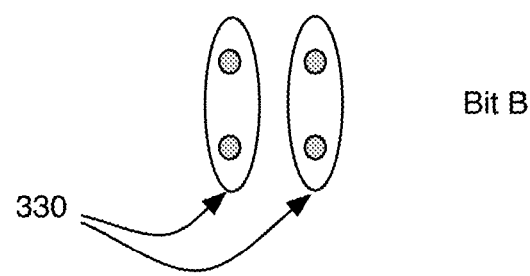
Figure 3B:
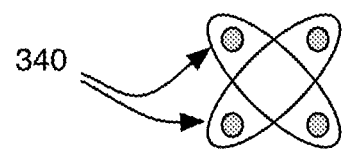

As in the example of FIG. 3A, the ovals in FIG. 3B identify signal pairs carrying opposing values. However, unlike in the previous example where only one transmission mode 303 was available for use, in the example of FIG. 3B each of the three illustrated modes 320, 330, and 340 may be used simultaneously to transmit A, B, and C. Thus, the observed signal levels on W, X, Y, Z used in such manner correspond to the sums of the three modes.

One familiar with the art will note that all possible values of A, B, C encoded in this manner result in mode summed values for W, X, Y, Z which are balanced; that is, summing to the constant value zero. If the mode summed values for W, X, Y, Z are scaled such that their maximum absolute value is 1 (that is, the signals are in the range +1 to −1 for convenience of description,) it will be noted that all achievable values are permutations of the values {+1, −1/3, −1/3, −1/3} or of the values {−1, 1/3, 1/3, 1/3}. These are called the code words of the vector signaling code H4.

H4 Code

Figure 8A:
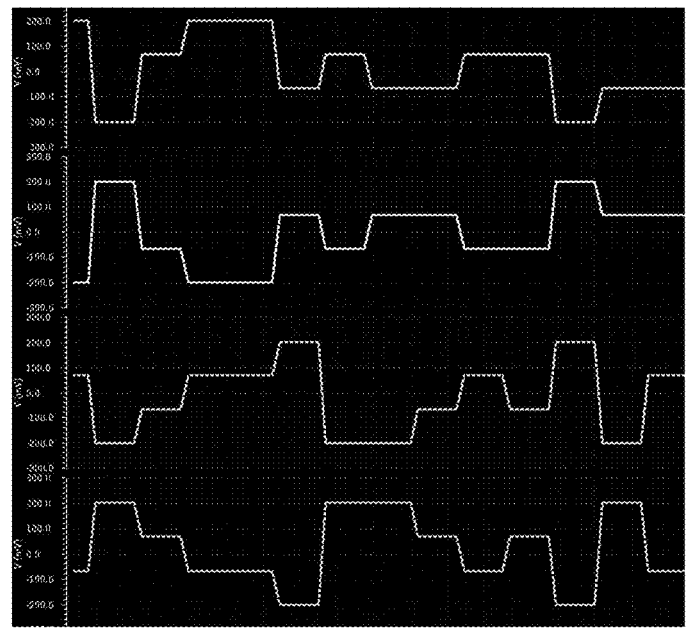
FIGS. 8A and 8B show individual wire signals of a transmitted H4 code and the combined signaling of all wires depicting the use of two of the four signal levels per transmit interval, in accordance with at least one embodiment of the invention.
Figure 8B:

As used herein, "H4" code, also called Ensemble NRZ code, refers to a vector signaling code and associated logic for such code wherein a transmitter consumes three bits and outputs signals on four wires in each symbol period. In some embodiments, parallel configurations comprising more than one group may be used, with each group comprising three bits transmitted on four wires per symbol period and an H4 encoder and an H4 decoder per group. With an H4 code, there are four signal wires and four possible coordinate values, represented herein as +1, +1/3, −1/3, and −1. The H4 code words are balanced, in that each code word is either one of the four permutations of (+1, −1/3, −1/3, −1/3) or one of the four permutations of (−1, +1/3, +1/3, +1/3), all such permutations summing to the equivalent of a zero value. H4 encoded signal waveforms are shown in FIG. 8A. It should be noted that although the constellation of all code words utilizes four distinct signal levels, only two signal levels will be utilized in any one code word, as is illustrated by a superposition of all four signal waveforms, as shown in FIG. 8B.

In a specific embodiment, a +1 might be sent as a signal using an offset of 200 mV, while a −1 is sent as a signal using an offset of −200 mV, a +1/3 is sent as a signal using an offset of 66 mV, and a −1/3 is sent as a signal using an offset of −66 mV, wherein the voltage levels are with respect to a fixed reference. Note that the average of all of the signals sent (or received, disregarding asymmetric effects of skew, crosstalk, and attenuation) in any single time interval regardless of the code word represented is "0", corresponding to the offset voltage. There are eight distinct code words in H4, which is sufficient to encode three binary bits per transmitted symbol interval.

Other variants of the H4 coding described above exist as well. The signal levels are given as examples, without limitation, and represent incremental signal values from a nominal reference level.

Encoder and Transmitter

Figure 1:
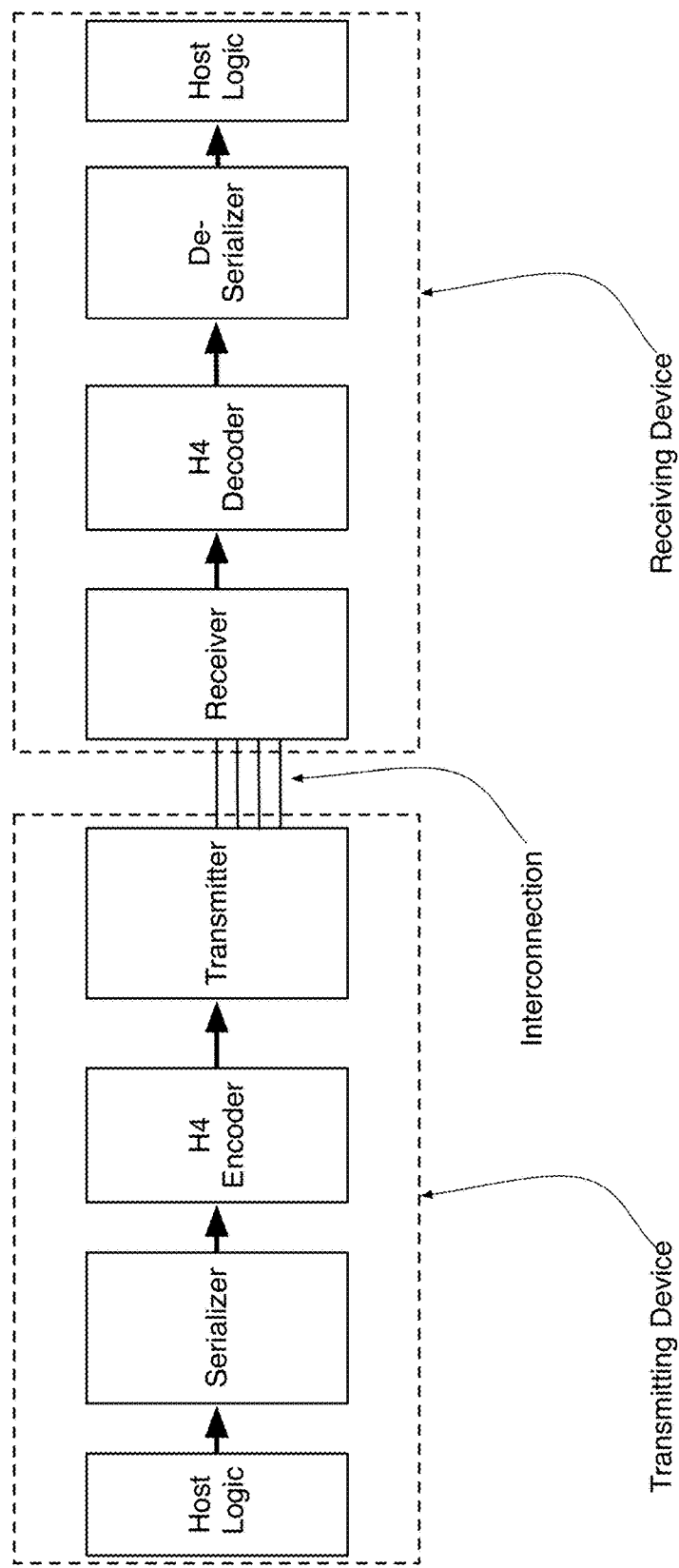
FIG. 1 is a block diagram of an example system comprising a transmitting device, interconnection, and receiving device, in accordance with at least one embodiment of the invention.
Figure 4:
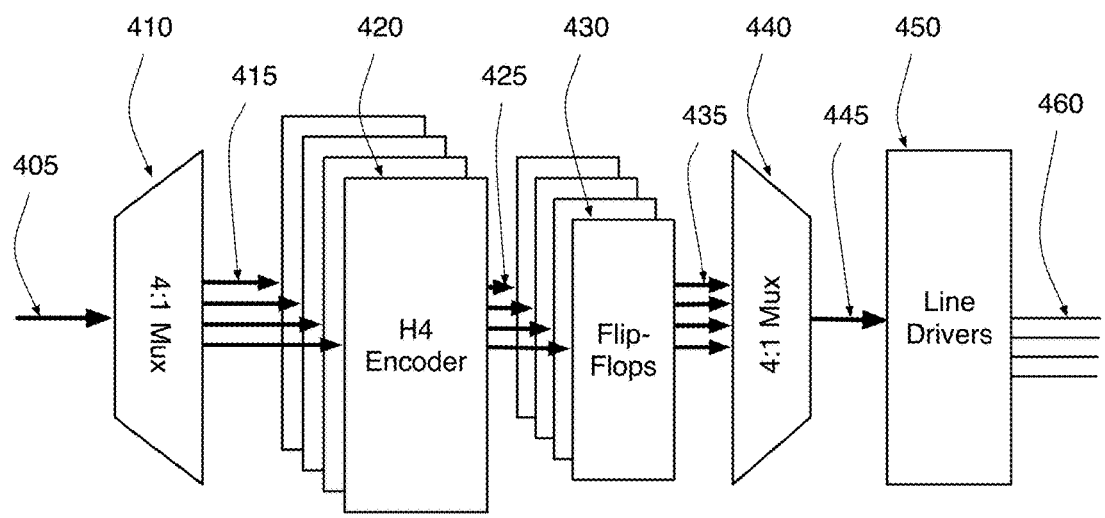
FIG. 4 is a block diagram of a H4 encoder and transmitter of the FIG. 1 system, in accordance with at least one embodiment of the invention.

FIG. 4 is a block diagram for one embodiment of the H4 encoder and transmitter components of the FIG. 1 system in accordance with the invention. This embodiment uses source- and destination-terminated current mode logic drivers with reduced signal swing.

High-speed communications embodiments often exceed the performance capabilities of a single communications circuit instance. As an example of how such a limitation is overcome, FIG. 4 shows as an example a 4:1 mux architecture that supports a line rate of as much as 4× the capabilities of a single circuit instance in the same process technology. Each of the processing stages 420 and 430 are embodied as four distinct instances, each instance processing source data into symbol data for one transmission interval. Any number of phases may be used, from a single phase performing all operations, to sixteen or more, with each of such multiple phases possibly also extending over a greater or lesser portion of the described transmission system than this example.

In one embodiment in accordance with the invention, source data, which may be subjected to scrambling, encryption, or encapsulation beyond the scope of this disclosure, is provided at 405. Multiplexer 410 sequentially distributes consecutive source data elements to the four encoding phases, and multiplexer 440 sequentially combines the resulting four encoded results into a single data stream for transmission. One embodiment accepts source data in twelve bit increments, which is then distributed as four three-bit portions to the four processing phases, and subsequently combined to produce the higher rate transmitted stream. Each H4 encoder 420 maps three bits of user data to one H4 code word, with the results buffered in flip-flops 430. At each symbol interval, one buffered H4 code word is selected, and then converted to the chosen wire signal levels by line drivers 450 for transmission on interconnection 460. This allows for transmission rates to be multiples of the processing rates of a single encoder or decoder.

The specific mapping function between three bits of source data and a specific H4 code word may be chosen for implementation convenience, as will be subsequently described.

Receiver and Decoder

The complementary receiver and decoder for the described H4 transmitter system perform a number of operations. The interconnection wires are terminated in a matched impedance, conventional amplification and filtration may be applied to compensate for channel attenuation, received signal levels corresponding to the symbol representations of the H4 code are measured, symbols interpreted as valid code words of the H4 code, and the detected code words mapped back to received data.

At least one embodiment in accordance with the invention combines at least some aspects of these receiver and decoder operations for efficiency. One embodiment in accordance with the invention shown in FIGS. 5A and 5B incorporate a differential comparator circuit operating on multiple inputs, summing the received signal values on two selected wires, summing the received signal values on the remaining two wires, and outputting a comparison of the two summed results. Such a multi-input comparator requires no fixed signal level reference and can provide a good level of common-mode noise rejection, in a circuit combining elements of line receiver and H4 code word detection operations. At least one embodiment in accordance with the invention further incorporates line equalization and amplification with the line receiver and code word detection operations.

Three instances of such multi-input comparator circuits operating on permutations of the same four input signals are sufficient to detect all code words of H4. That is, given a multi-input comparator that performs the operation $$R=(J+L)-(K+M) \tag{Eqn. 3}$$

where J, K, L, M are variables representing the four input signals values, then as one example and without limitation, the input permutations producing the three results $R_0$, $R_1$, $R_2$ based on the equations $$R_0=(W+Y)-(X+Z) \tag{Eqn. 4}$$

$$R_1=(Y+Z)-(W+X) \tag{Eqn. 5}$$

$$R_2=(Y+X)-(Z+W) \tag{Eqn. 6}$$

are sufficient to unambiguously identify each code word of vector signaling code H4 as represented by receive signal input values W, X, Y, Z. The values $R_0$, $R_1$, $R_2$ may represent analog signal results if both the addition and difference functions are performed linearly, or may represent binary outputs if the difference function is performed by a digital comparator, equivalent to performing a sign( ) function on analog outputs. Because of the nature of the encoded H4 code words, none of the analog results $R_0$, $R_1$, $R_2$ will be at zero, implying that none of the corresponding digital comparator results will be ambiguous.

For some encoder mappings of source data to transmitted H4 code words, a direct relationship between the detected result of these three receive comparators and the receive data exists, eliminating the need for additional decode mapping logic at the receiver. Thus, a preferred embodiment will first select the desired permutations of input signals to be processed by each of the three multi-input receive comparators, will then document the three comparator output values obtained for each valid code word, and will then define a transmit mapping function that performs the corresponding mapping of three transmit data bits to the four transmit signal values of the corresponding code word. One example of such a mapping is shown in FIG. 6.

Figure 5A:
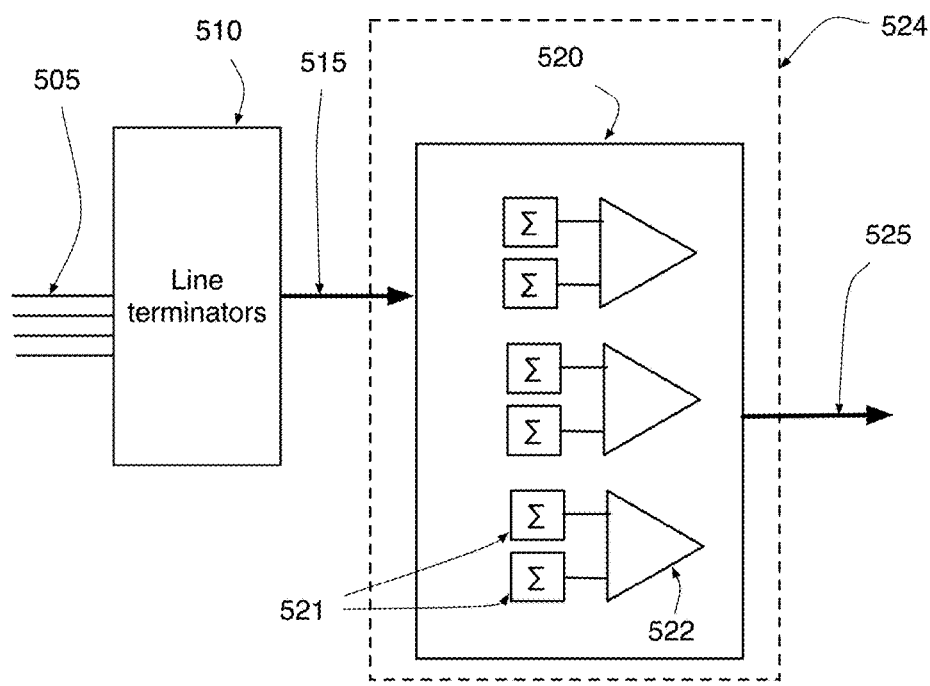
FIGS. 5A and 5B show block diagrams for the receiver and H4 decoder components of the FIG. 1 system utilizing a single process phase and multiple processing phases, in accordance with at least one embodiment of the invention.

FIG. 5A shows a block diagram of such a receiver for a group of four wires using the H4 code. Each receive interconnection line 505 is terminated at 510. In some embodiments, line termination may further incorporate overvoltage protection, DC blocking capacitors, and introduction of a common mode or bias voltage for subsequent processing stages. Terminated receive signals 515 are presented to multi-input comparators 520, which perform the H4 detection by performing summation 521 and difference or comparison 522 operations. In this example, a direct mapping of comparator outputs to received data 525 is shown.

Figure 5B:
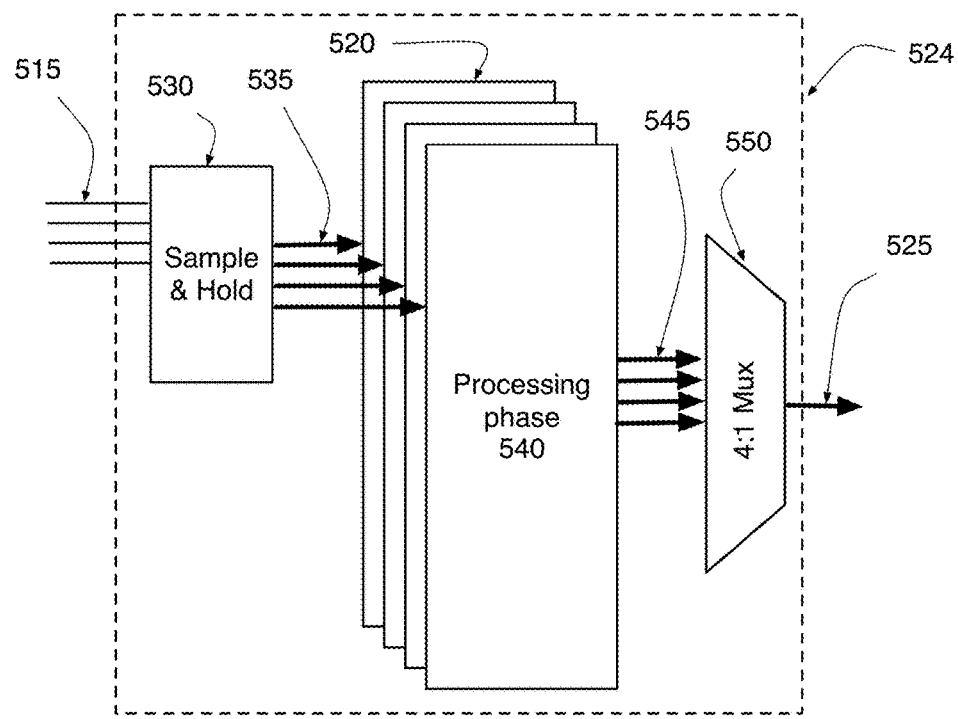

As with the described transmitter example, multiple processing phases may be used to allow symbol signaling rates greater than might be supported by a single circuit instance in the available semiconductor technology. FIG. 5B illustrates multi-phase receive processing, with an example four phase embodiment of receive comparator subsystem 524. To show the transparent nature of the multi-phase processing technique, the example portion 524 of FIG. 5A may be replaced by the four phase embodiment of FIG. 5B, retaining common inputs 515 and outputs 525.

As shown in FIG. 5B, terminated receive signals 515 are captured by sample-and-hold 530, providing stable signal levels 535 as inputs to each of the example four processing phases 540. To provide the maximum processing time to each processing phase 540 (which in this example is comprised of the receive comparator component 520 of FIG. 5A), one sample-and-hold per input signal is provided per phase (thus, in this example, sixteen total) with each operating at one quarter the receive symbol rate. Detected results 545 from all phases are combined by multiplexer 550 into a combined received data stream equivalent to that of FIG. 5A. Other embodiments may incorporate different numbers of phases and/or different numbers of sample-and-hold elements providing different timing constraints, and may incorporate greater or lesser amounts of the receive system into the multiple processing phases.

H4 Code with Digital Feedback Equalization

Modern high-speed serial receiver designs are strongly reliant on Decision Feedback Equalization (DFE) methods, which are well known solutions for compensation of transmission medium perturbations including signal reflections and crosstalk. It had been observed that such perturbations are driven by delayed components of previously transmitted data (e.g. as delayed reflections from impedance discontinuities in the communications path) which interfere with subsequently transmitted data. Thus, detected data may be stored by a DFE system at the receiver, and suitably delayed and attenuated components subtracted from the current input signal so as to nullify those effects.

This simple feedback loop DFE is constrained by the need to fully detect the value of the currently received data bit in time to feed it back as compensation for signals in the next signal interval. As transmission rates increase, this window of time becomes smaller. Furthermore, distributing receive processing across multiple processing phases increases throughput, at the cost of latency. Thus, information about a given receive interval's data may not be available for many receive cycles. Solutions using "unrolled" DFE correction are known, allowing inline compensation to be performed for the critical initial receive intervals of the DFE process.

Classic binary DFE solutions may be combined with the described H4 receiver designs at the point where individual modulation modes (representing individual data bits) are detected, if the signal reflections requiring compensation are similar for the four signal paths. Each mode is communicated as signals over all four signal paths, but the combinations of such signals is by definition orthogonal for each mode, thus signal perturbations on distinct paths is possible through judicious combination of modal compensations. It should be noted that signals encoded on the wire may take on any of four values (albeit two at any one time) while signals representing each transmission mode are always two-valued. Thus, storage and delay components of a DFE are at least twice as complex if performed on wire signals versus modulation mode signals.

Figure 7A:
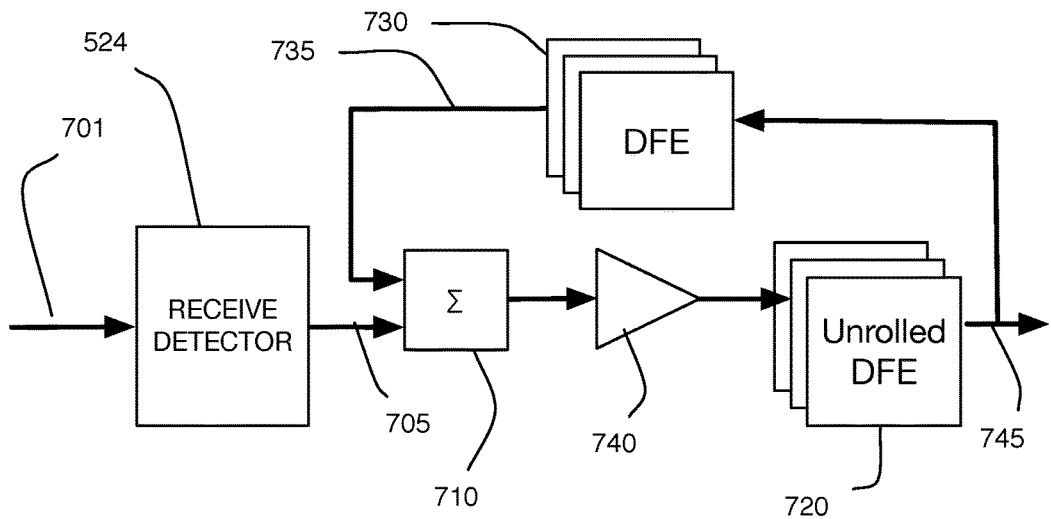
FIGS. 7A and 7B show block diagrams of receivers incorporating two approaches to DFE compensation, in accordance with at least one embodiment of the invention.

One embodiment in accordance with the invention is shown in the block diagram of FIG. 7A. The four receive signal inputs 701 are input to receive detector 524 (previously described in FIGS. 5A and 5B), which in this example is configured to produce three analog outputs 705 corresponding to the transmission modes used to communicate each data bit. On each such analog output, a DFE correction signal 735 from one of three binary DFE circuits 730 is summed 710 to nullify the signal distortions on that analog signal, and the signals optionally converted to digital value by comparators 740.

As is well known to those familiar with the art, the required high gain of a digital comparator is often obtained using a series of stages of moderate gain. External signals may be injected at an interconnecting circuit node between two such stages; in one common example, an adjustable DC level is introduced at such a node to correct the comparator's input balance or offset. In another embodiment, elements 710 and 740 may thus represent stages within a multi-input comparator as in 520 of FIG. 5A. One familiar with the art will observe that a DFE correction signal may also be introduced at other circuit nodes, as one example at a comparator input, providing equivalent functionality.

As is common practice, the Decision Feedback Equalization corresponding to at least the first several bit times preceding the current receive interval are "unrolled" or performed inline along with the data path processing for higher performance, rather than by a closed loop feedback method, by the three unrolled binary DFE circuits 720, with DFE corresponding to the remaining bit times being compensated being performed by conventional feedback loop DFE at 730.

In the embodiment shown, feedback DFE circuits 730 accept digital bit inputs and output appropriately scaled and delayed analog signals, while unrolled DFE circuits 720 accepts digital inputs and produces digital bit outputs. Other embodiments in accordance with the invention may utilize different combinations of input signals and output results in the DFE components. In one embodiment, the three DFE circuits 730 operate on analog values 725, rather than from the equivalent binary values 745 obtained from comparators 740.

Figure 7B:
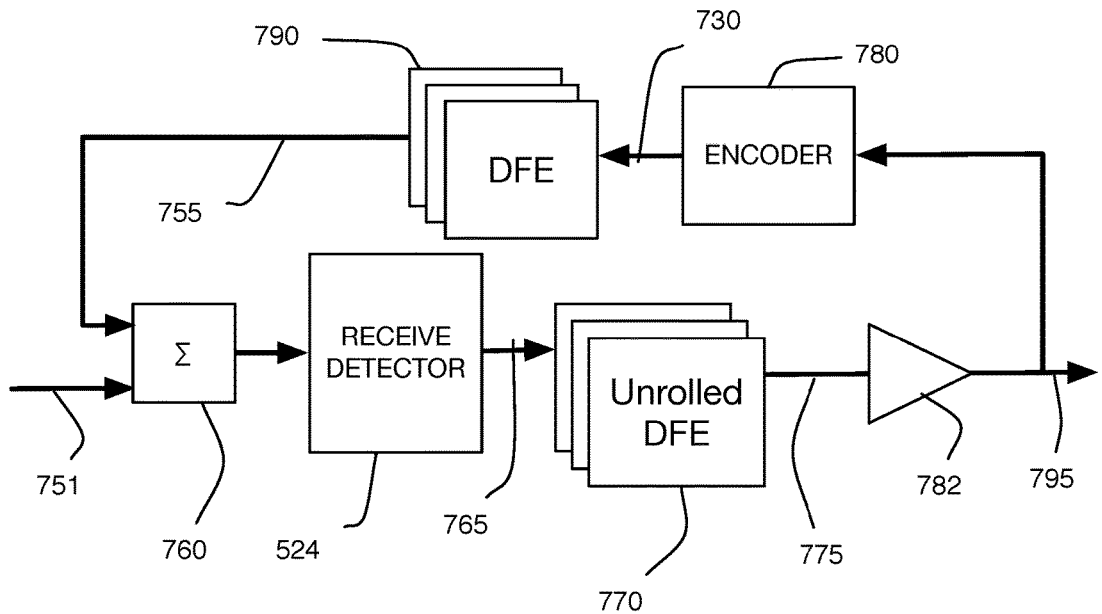

An alternative and more complex DFE embodiment of the invention is also known, which may be applied if the reflections are markedly different amongst the four wires. In this approach shown in FIG. 7B, DFE is performed by adding 760 four DFE correction signals 755, one for each analog wire signal 751 rather than for each transmission mode, allowing independent equalization for each physical wire path at the cost of significantly greater complexity and power consumption. The compensated wire signals are processed by receive detector 524 to produce outputs 765. In such an embodiment, at least the first several bits may be equalized by an unrolled binary DFE 770 operating on the three individual modulation modes as before. For corrections beyond that amount, an enhanced architecture DFE is used. The three data outputs 795 are re-encoded 780 into the corresponding four level symbol representation 736 used on the line, and four four-level DFE circuits 790 perform the remainder of the equalization, each operating on one wire-level signal to produce compensation signals 755. In some embodiments, the function of digital comparators 782 are performed within DFE 770, so that outputs 775 are equivalent to outputs 795. Similarly, in at least one embodiment unrolled DFE 770 operates on digital output signals from receive detector 524 representing binary data bits.

The number of bits of DFE compensation utilized in either described embodiment of the invention, both as inline "unrolled" DFE and as conventional feedback DFE, may be chosen based on the needs of the specific communications system, without limitation. At least one embodiment in accordance with the invention includes at least some DFE operations within the multiphase processing portion of the receiver.

Receive Method Description

Figure 9:
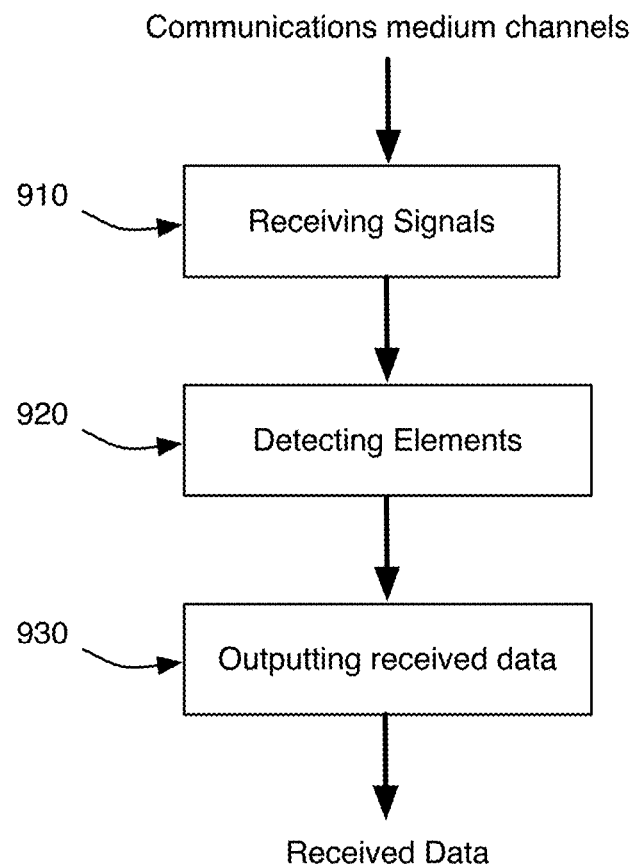
FIG. 9 is a block diagram illustrating the method of claims 1-5.

To summarize and clarify the previous descriptions of receiver operations and their interactions with receive mode DFE and/or receive signal DFE, the following descriptions are made using the diagram of FIG. 9.

In element 910, signals from the separate channels of the communications medium are received, obtaining channel signal values representing the signal of each channel.

In some embodiments, additional processing including amplification, filtering, and frequency-dependent amplification may be performed on the signals of each channel as part of obtaining channel signal values, as is common practice. In some embodiments, correction signals derived from past channel activity are incorporated in this additional processing, as one example to neutralize past signal reflections and other spurious communications channel effects. Such correction based on past activity is known as Decision Feedback Equalization, herein being applied to channel signals.

In element 920, elements of the vector signaling code are detected by a method comprising obtaining a first sum of two selected channel signal values, obtaining a second sum of the remaining two channel signal values, and comparison of the first sum and the second sum to obtain the detected element. Multiple elements are detected by choosing different selected channel signal values for each element; for the example H4 vector signaling code, three such elements may be detected by three different permutations of channel signal values used to produce a first sum and a second sum.

In some embodiments, correction signals derived from previously detected elements of the vector signaling code are incorporated into detection of current elements of the vector signaling code, as one example in an alternative method of neutralizing past signal reflections and other spurious communications channel effects. As examples, a correction signal representing a compensation for past signal reflections and other spurious communication channel effects impacting one or more particular modulation modes may be introduced into element detection, so as to modify inputs to the comparison, or to bias the comparison operation itself. Such correction based on past activity is known as Decision Feedback Equalization, herein being applied to modulation modes of the communications channel.

In element 920, elements of the vector signaling code are detected by a method comprising obtaining a first sum of two selected channel signal values, obtaining a second sum of the remaining two channel signal values, and comparison of the first sum and the second sum to obtain the detected element. Multiple elements are detected by choosing different selected channel signal values for each element; for the example H4 vector signaling code, three such elements may be detected by three different permutations of channel signal values used to produce a first sum and a second sum.

In element 930, received data derived from the detected elements of the vector signaling code are output. As previously described, in preferred embodiments the transmit encoding is chosen such that the detected elements of the vector signaling code directly correspond to bits of the received data.

The described method thus measures and acts upon physical signal inputs, and produces a physical result of received data, which may be acted upon by subsequent components of a larger system or process.

The examples presented herein illustrate the use of vector signaling codes for point-to-point chip-to-chip interconnection. However, this should not been seen in any way as limiting the scope of the described invention. The methods disclosed in this application are equally applicable to other interconnection topologies and other communication media including optical, capacitive, inductive, and wireless communications. Thus, descriptive terms such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

We claim:

1. A method comprising:
   receiving symbols of a codeword of a balanced vector signaling code via wires of a multi-wire bus;
   introducing, via a respective signal summation node on each wire of the multi-wire bus, a corresponding correction signal for each wire, the correction signal generated based on a re-encoded symbol of a re-encoded codeword, the re-encoded codeword obtained by re-encoding a previously-decoded codeword;
   forming a plurality of output signals using a plurality of multi-input comparators, each output signal formed by a respective multi-input comparator forming a respective weighted combination of the received symbols of the codeword, the respective weighted combination determined by a corresponding vector of an orthogonal matrix;
   forming a plurality of output data bits from the plurality of output signals; and
   generating a re-encoded codeword based on the plurality of output data bits for use in a set of symbols of a codeword received in a subsequent unit interval.

2. The method of claim 1, wherein the symbols of the codeword of the balanced vector signaling code have symbol values selected from the set $\{\pm 1/3, \pm 1\}$.

3. The method of claim 2, wherein the codeword is a permutation of $\pm[1, -1/3, -1/3, -1/3]$.

4. The method of claim 1, wherein the orthogonal matrix is a Hadamard matrix.

5. The method of claim 4, wherein the Hadamard matrix is represented as:

$$H_4 = \begin{bmatrix} +1 & +1 & +1 & +1 \\ +1 & -1 & +1 & -1 \\ +1 & +1 & -1 & -1 \\ +1 & -1 & -1 & +1 \end{bmatrix},$$

and wherein the respective weighted combinations are represented by respective column vectors that sum to zero.

6. The method of claim 1, wherein forming the respective combination comprises:
obtaining a respective first sum of a first selected pair of symbols;
obtaining a respective second sum of a second selected pair of symbols; and
comparing the respective first sum and the respective second sum to obtain the respective output signal.

7. The method of claim 1, wherein the symbols of the re-encoded codeword are digital symbols.

8. The method of claim 1, wherein each correction signal has one of at least four possible values.

9. The method of claim 1, further comprising combining un-rolled decision-feedback equalization (DFE) with the plurality of output signals prior to generating the re-encoded codeword.

10. An apparatus comprising:
a set of summation nodes, each summation node configured to receive a respective symbol of a codeword of a balanced vector signaling code via a respective wire of a multi-wire bus and to responsively introduce a corresponding correction signal into the respective wire, the correction signal representing a re-encoded symbol of a re-encoded codeword, the re-encoded codeword obtained by re-encoding a previously-decoded codeword;
a plurality of multi-input comparators configured to form a plurality of output signals, each multi-input comparator configured to form a respective output signal by forming a respective weighted combination of the received symbols of the codeword, the respective weighted combination determined by a corresponding vector of an orthogonal matrix;
a plurality of slicers configured to receive the plurality of output signals and to responsively generate a plurality of output data bits; and
an encoder configured to generate a re-encoded codeword based on the output data bits for use in a set of symbols of a codeword received in a subsequent unit interval.

11. The apparatus of claim 10, wherein the symbols of the codeword of the balanced vector signaling code have symbol values selected from the set $\{\pm 1/3, \pm 1\}$.

12. The apparatus of claim 11, wherein the codeword is a permutation of $\pm[1, -1/3, -1/3, -1/3]$.

13. The apparatus of claim 10, wherein the orthogonal matrix is a Hadamard matrix.

14. The apparatus of claim 13, wherein the Hadamard matrix is represented as:

$$H_4 = \begin{bmatrix} +1 & +1 & +1 & +1 \\ +1 & -1 & +1 & -1 \\ +1 & +1 & -1 & -1 \\ +1 & -1 & -1 & +1 \end{bmatrix},$$

and wherein the respective weighted combinations are represented by respective column vectors that sum to zero.

15. The apparatus of claim 10, wherein the multi-input comparators are configured to:
obtain a respective first sum of a first selected pair of symbols;
obtain a respective second sum of a second selected pair of symbols; and
compare the respective first sum and the respective second sum to obtain the respective output signal.

16. The apparatus of claim 10, wherein the symbols of the re-encoded codeword are digital symbols.

17. The apparatus of claim 10, wherein each correction signal has one of at least four possible values.

18. The apparatus of claim 10, further comprising un-rolled decision-feedback equalization (DFE) circuits configured to perform unrolled DFE on the plurality of output signals prior to generating the re-encoded codeword.

* * * * *